United States Patent
Yamada

(10) Patent No.: US 12,198,891 B2
(45) Date of Patent: Jan. 14, 2025

(54) CHARGED PARTICLE BEAM WRITING APPARATUS, CHARGED PARTICLE BEAM WRITING METHOD AND RECORDING MEDIUM

(71) Applicant: NuFlare Technology, Inc., Yokohama (JP)

(72) Inventor: Taku Yamada, Yokohama (JP)

(73) Assignee: NuFlare Technology, Inc., Yokohama (JP)

(*) Notice: Subject to any disclaimer, the term of this patent is extended or adjusted under 35 U.S.C. 154(b) by 384 days.

(21) Appl. No.: 17/811,985

(22) Filed: Jul. 12, 2022

(65) Prior Publication Data

US 2022/0367143 A1 Nov. 17, 2022

Related U.S. Application Data

(63) Continuation of application No. PCT/JP2021/000838, filed on Jan. 13, 2021.

(30) Foreign Application Priority Data

Feb. 5, 2020 (JP) ................. 2020-017697

(51) Int. Cl.
*H01J 37/147* (2006.01)
*G03F 7/20* (2006.01)
(Continued)

(52) U.S. Cl.
CPC ........ *H01J 37/1472* (2013.01); *G03F 7/2059* (2013.01); *H01J 37/153* (2013.01);
(Continued)

(58) Field of Classification Search
None
See application file for complete search history.

(56) References Cited

U.S. PATENT DOCUMENTS 11,251,012 B2   2/2022   Yamada
2021/0305008 A1  9/2021   Yamada

FOREIGN PATENT DOCUMENTS

JP   60-085519 A   5/1985
JP   05-304080 A   11/1993
(Continued)

OTHER PUBLICATIONS

International Search Report issued Mar. 9, 2021 in PCT/JP2021/000838 filed on Jan. 13, 2021, 2 pages.

*Primary Examiner* — Eliza W Osenbaugh-Stewart
(74) *Attorney, Agent, or Firm* — Oblon, McClelland, Maier & Neustadt, L.L.P.

(57) ABSTRACT

A difference between a calculated amount of drift and an actual amount of drift is reduced. According to one aspect of the present invention, a charged particle beam writing apparatus includes a deflector adjusting an irradiation position of the charged particle beam with respect to a substrate placed on a stage, a shot data generator generating shot data from writing data, the shot data including a shot position and beam ON and OFF times for each shot, a drift corrector referring to a plurality of pieces of the generated shot data, calculating an amount of drift of the irradiation position of the charged particle beam with which the substrate is irradiated, and generating correction information for correcting an irradiation position deviation based on the amount of drift, a deflection controller controlling a deflection amount achieved by the deflector based on the shot data and the correction information, and a dummy irradiation instructor instructing execution of dummy irradiation in a writing process to irradiate with the charged particle beam in a predetermined irradiation amount at a position different from the substrate on the stage.

9 Claims, 6 Drawing Sheets

(51) Int. Cl.
  *H01J 37/153*  (2006.01)
  *H01J 37/304*  (2006.01)
  *H01J 37/317*  (2006.01)
  *H01L 21/027*  (2006.01)
(52) U.S. Cl.
  CPC ...... *H01J 37/3045* (2013.01); *H01J 37/3174* (2013.01); *H01J 2237/30455* (2013.01); *H01L 21/027* (2013.01)

(56) References Cited

FOREIGN PATENT DOCUMENTS

| | | |
|---|---|---|
| JP | 09-045602 A | 2/1997 |
| JP | 2956628 B2 | 10/1999 |
| JP | 2001-319853 A | 11/2001 |
| JP | 4439038 B2 | 3/2010 |
| JP | 2010-267909 A | 11/2010 |
| JP | 6981380 B2 | 12/2021 |
| WO | WO 2020/026696 A1 | 2/2020 |

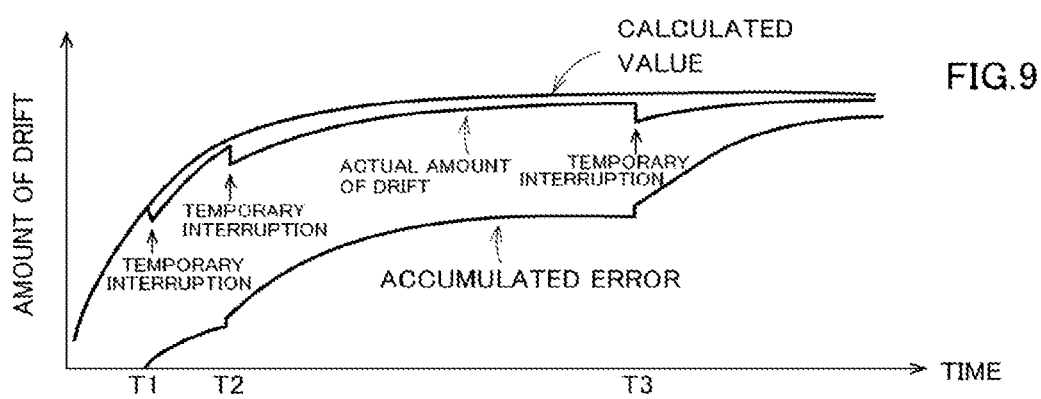
FIG.8
FIG.9
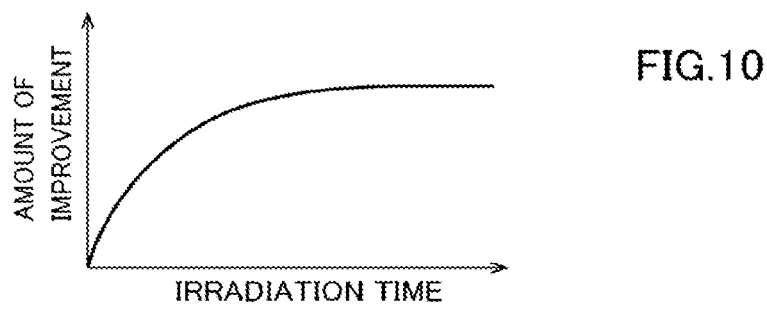
FIG.10

CHARGED PARTICLE BEAM WRITING APPARATUS, CHARGED PARTICLE BEAM WRITING METHOD AND RECORDING MEDIUM

TECHNICAL FIELD

The present invention relates to a charged particle beam writing apparatus, a charged particle beam writing method and a recording medium.

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In an electron beam writing apparatus, due to various factors, a phenomenon called beam drift may occur, in which the irradiation position of an electron beam is shifted as time elapses during writing. Beam drift occurs, for example, because contamination adheres to an irradiation system of a deflection electrode or the like of the writing apparatus, and the contamination is charged by electrons scattered from a target writing substrate. To cancel the beam drift, drift correction is performed.

For example, PTL 1 discloses a technique that calculates an amount of drift from a correction calculation expression using parameters, and corrects a deflection amount achieved by a deflector, the parameters being a beam current amount, a beam irradiation position, and beam ON and OFF times for each shot. However, because the amount of accumulated electric charge on the deflector surface is calculated for each shot, the amount of calculation increases as the number of shots increases.

In such a conventional technique, irradiation information on beam needs to be known exactly to implement highly accurate drift correction. In an actual writing process, an unexpected writing interruption operation may occur due to waiting for data transfer, a writing temporary suspension operation and the like. However, interruption of writing has not been considered in correction calculation. Therefore, an error between a calculated amount of drift and the actual amount of drift is gradually accumulated as time passes, which sometimes affected to the accuracy of writing.

CITATION LIST

Patent Literature

PTL 1: Japanese Patent No. 4439038
PTL 2: JP S60-85519 A
PTL 3: JP 2010-267909 A
PTL 4: JP H9-45602 A
PTL 5: Japanese Patent No. 2956628
PTL 6: JP H5-304080 A
PTL 7: JP 2001-319853 A

SUMMARY OF INVENTION

It is an object of the present invention to provide a charged particle beam writing apparatus, a charged particle beam writing method and a charged particle beam writing program that are capable of reducing the difference between the calculated amount of drift and the actual amount of drift.

According to one aspect of the present invention, a charged particle beam writing apparatus includes a charged particle beam source, a deflector adjusting an irradiation position of the charged particle beam with respect to a substrate placed on a stage, a shot data generator generating shot data from writing data, the shot data including a shot position and beam ON and OFF times for each shot, a drift corrector referring to a plurality of pieces of the generated shot data, calculating an amount of drift of the irradiation position of the charged particle beam with which the substrate is irradiated, based on the shot position and the beam ON and OFF times of each of a plurality of shots, and generating correction information for correcting an irradiation position deviation based on the amount of drift, a deflection controller controlling a deflection amount achieved by the deflector based on the shot data and the correction information, and a dummy irradiation instructor instructing execution of dummy irradiation in a writing process to irradiate with the charged particle beam in a predetermined irradiation amount at a position different from the substrate on the stage.

According to one aspect of the present invention, a charged particle beam writing method includes a step of discharging a charged particle beam, a step of adjusting an irradiation position of the charged particle beam using a deflector with respect to a substrate placed on a stage, a step of generating shot data from writing data, the shot data including a shot position and beam ON and OFF times for each shot, a step of referring to a plurality of pieces of the generated shot data, and calculating an amount of drift of the irradiation position of the charged particle beam with which the substrate is irradiated, based on the shot position and the beam ON and OFF times of each of a plurality of shots, a step of generating correction information for correcting an irradiation position deviation based on the amount of drift, a step of controlling a deflection amount achieved by the deflector based on the shot data and the correction information, and a step of executing dummy irradiation in a writing process to irradiate with the charged particle beam in a predetermined irradiation amount at a position different from the substrate on the stage.

According to one aspect of the present invention, a computer readable recording medium storing a program causing a computer to execute a process includes discharging a charged particle beam, adjusting an irradiation position of the charged particle beam using a deflector with respect to a substrate placed on a stage, generating shot data from writing data, the shot data including a shot position and beam ON and OFF times for each shot, referring to a plurality of pieces of the generated shot data, and calculating an amount of drift of the irradiation position of the charged particle beam with which the substrate is irradiated, based on the shot position and the beam ON and OFF times of each of a plurality of shots, generating correction information for correcting an irradiation position deviation based on the amount of drift, controlling a deflection amount achieved by the deflector based on the shot data and the correction information, and executing dummy irradiation in a writing process to irradiate with the charged particle beam in a predetermined irradiation amount at a position different from the substrate on the stage.

Advantageous Effects of Invention

According to the present invention, it is possible to reduce the difference between the calculated amount of drift and the actual amount of drift.

BRIEF DESCRIPTION OF DRAWINGS

FIG. 8 is a table illustrating an example of a relationship between the number of accumulated shots and a drift calculation time.

FIG. 9 shows graphs illustrating a change in drift amount calculation value and a change in actual amount of drift according to a comparative example.

FIG. 10 is a graph illustrating a relationship between dummy irradiation time and amount of improvement of a drift amount error.

DESCRIPTION OF EMBODIMENTS

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
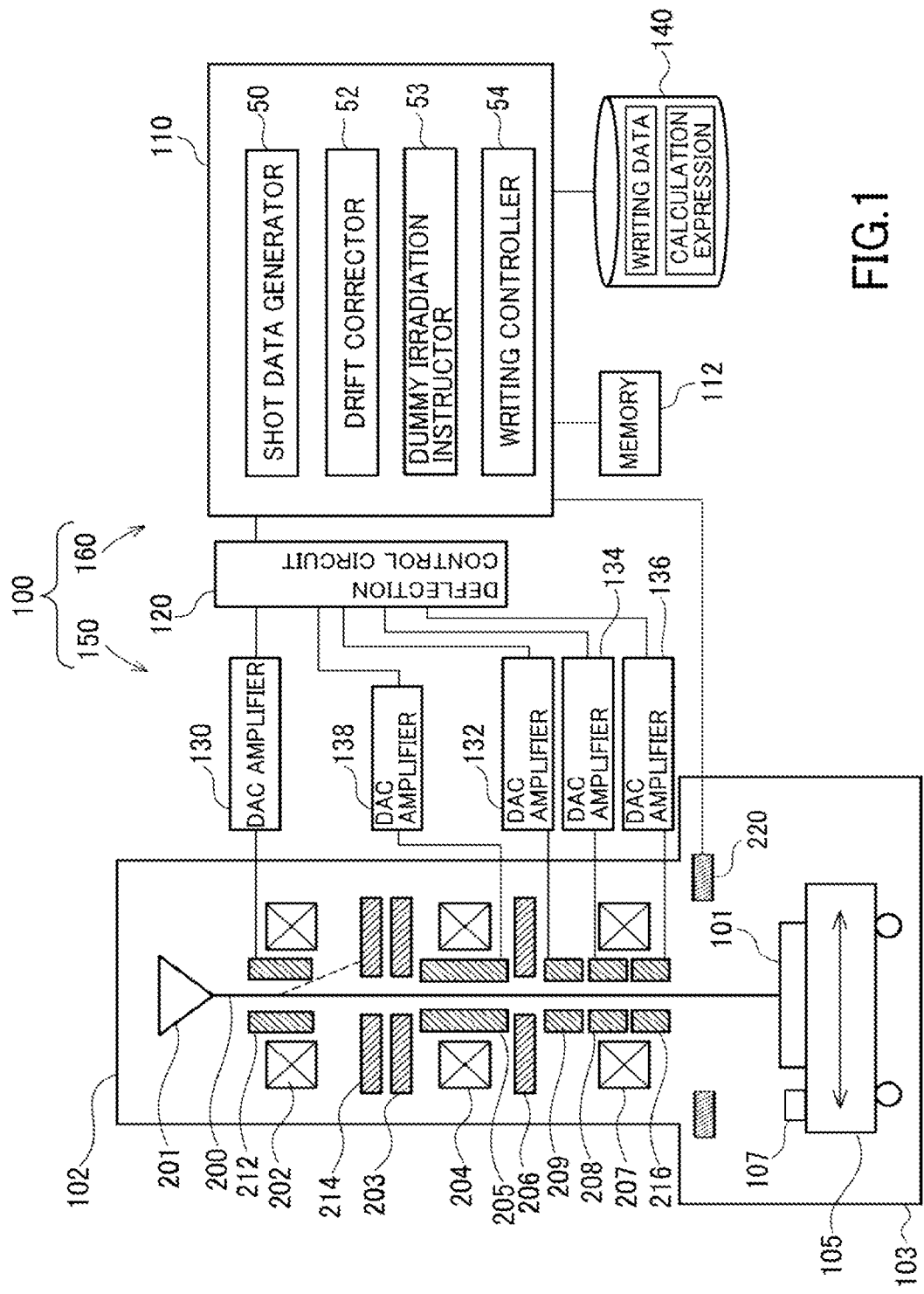
FIG. 1 is a schematic diagram of a charged particle beam writing apparatus according to an embodiment of the present invention.

FIG. 1 is a conceptual diagram illustrating the configuration of a writing apparatus in the embodiment. In FIG. 1, a writing apparatus 100 includes a writer 150 and a controller 160. The writer 150 includes an electron column 102 and a writing chamber 103. In the electron column 102, an electron gun 201, an illuminating lens 202, a blanking deflector 212, a blanking aperture 214, a first shaping aperture 203, a projection lens 204, a shaping deflector 205, a second shaping aperture 206, an objective lens 207, a main deflector 208, a sub-deflector 209, and a sub-sub-deflector 216 are disposed.

In the writing chamber 103, an XY stage 105 movable in the XY directions is placed. On the XY stage 105, a substrate 101 is placed, which is a writing target coated with a resist. The substrate 101 includes a mask for exposure, a silicon wafer, mask blanks and the like for manufacturing a semiconductor device.

On the XY stage 105, a member to be irradiated 107 is provided at a position different from the area where the substrate 101 is disposed, the member to be irradiated 107 being to be irradiated with an electron beam at the time of dummy irradiation described below. The member to be irradiated 107 is, for example, a Faraday cup to measure a beam current of the electron beam and a reflection mark to measure the amount of drift of the electron beam.

The reflection mark has, for example, a cross shape or a dot shape, and is composed of heavy metal such as tantalum or tungsten on a silicon substrate. At a position above the XY stage 105, an irradiation position detector 220 is provided, that detects an irradiation position (beam position) of an electron beam by irradiating the reflection mark with the electron beam. As the irradiation position detector 220, for example, an electron detector can be used, that scans the mark with an electron beam and detects a reflection electron reflected by the mark as a current value. The detected beam position is notified to the later-described control computer 110.

When an electron beam 200 discharged from the electron gun 201 (discharger) provided in the electron column 102 passes through the blanking deflector 212, whether or not the substrate is irradiated with the electron beam is switched by the blanking deflector 212.

The first shaping aperture 203 having a rectangular opening A1 (see FIG. 2) is irradiated with the electron beam 200 by the illuminating lens 202. The electron beam 200 passes through the opening A1 of the first shaping aperture 203, thereby being shaped into a rectangle.

Figure 2:
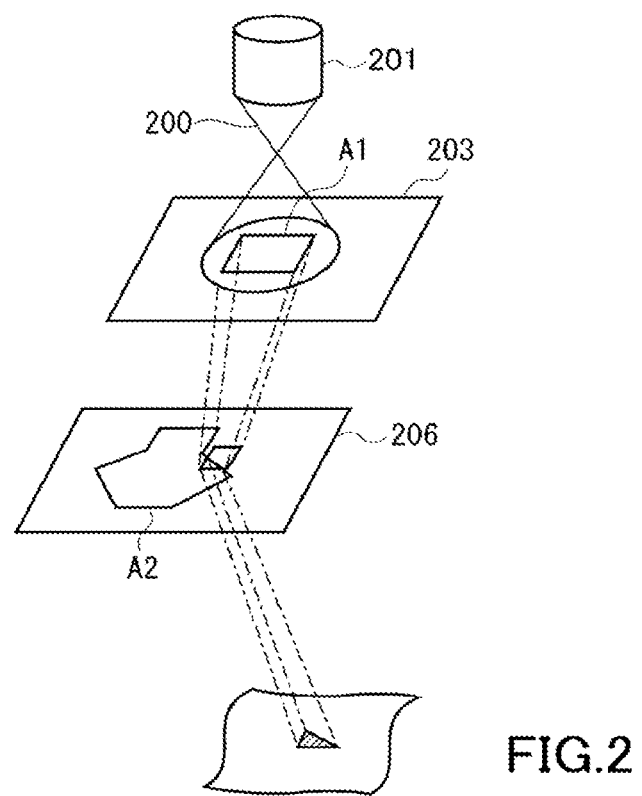
FIG. 2 is a perspective view of a first shaping aperture and a second shaping aperture.

Having passed through the first shaping aperture 203, the electron beam 200 shaped into a first aperture image is projected by the projection lens 204 on the second shaping aperture 206 having a variable shaped opening A2 (see FIG. 2). At this point, the first aperture image projected on the second shaping aperture 206 is deflection-controlled by the shaping deflector 205, thus it is possible to change (perform variable shaping) the shape and size of the electron beam passing through the variable shaped opening A2.

Having passed through the variable shaped opening A2 of the second shaping aperture 206, the electron beam 200 shaped into a second aperture image is focused by the objective lens 207, deflected by the main deflector 208, the sub-deflector 209, and the sub-sub-deflector 216, and is radiated to the substrate 101 placed on the XY stage 105 which continuously moves.

The controller 160 has a control computer 110, a memory 112, a deflection control circuit 120, DAC (digital and analog converters) amplifiers 130, 132, 134, 136, 138 (deflection amplifiers), and a storage device 140.

The DAC amplifiers 130, 132, 134, 136, 138 are connected to the deflection control circuit 120. The DAC amplifier 130 is connected to the blanking deflector 212. The DAC amplifier 132 is connected to the sub-deflector 209. The DAC amplifier 134 is connected to the main deflector 208. The DAC amplifier 136 is connected to the sub-sub-deflector 216. The DAC amplifier 138 is connected to the shaping deflector 205.

The control computer 110 includes a shot data generator 50, a drift corrector 52, a dummy irradiation instructor 53 and a writing controller 54. The functions of the shot data generator 50, the drift corrector 52, the dummy irradiation instructor 53 and the writing controller 54 may be implemented by software or implemented by hardware.

Figure 3:
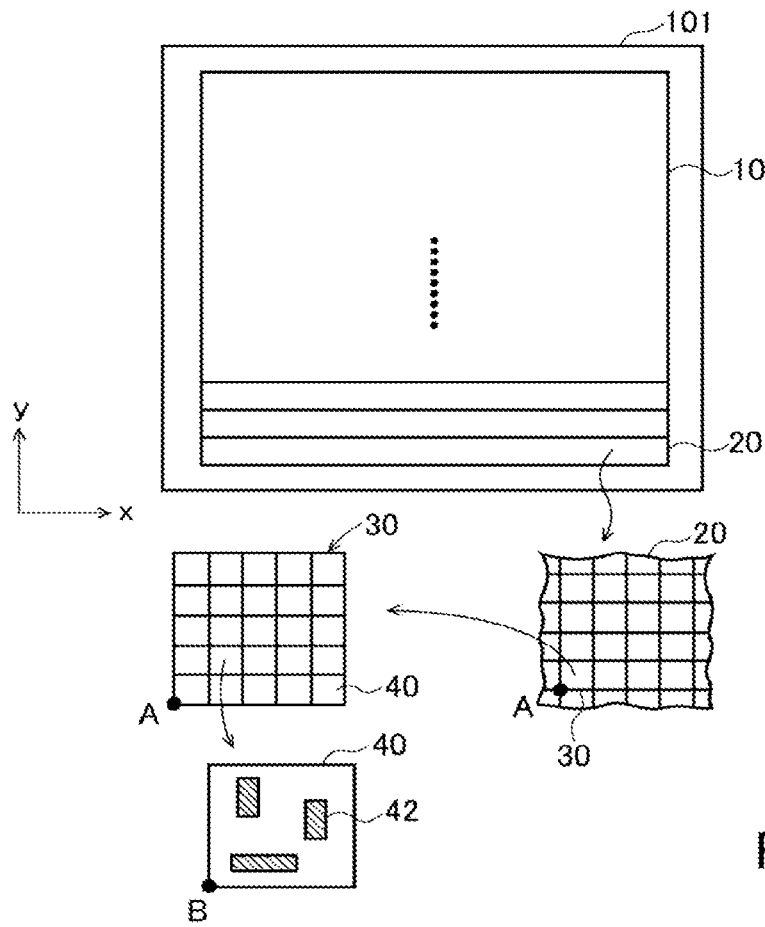
FIG. 3 is a conceptual chart for explaining a deflection area.

FIG. 3 is a conceptual chart for explaining a deflection area. As illustrated in FIG. 3, a writing area 10 of the substrate 101 is virtually divided with a deflectable width of the main deflector 208 into multiple rectangular strip areas 20 in the y direction, for example. Then, the areas obtained by dividing each strip area 20 in the x direction with the deflectable width of the main deflector 208 provide deflection areas (main deflection areas) of the main deflector 208.

These main deflection areas are each virtually divided into multiple mesh-shaped sub-fields (SF) 30 with a deflectable size of the sub-deflector 209. Each SF 30 is then virtually divided into multiple mesh-shaped under sub-fields (here referred to as "TF" using an abbreviation for Tertiary Deflection Field which means the third deflection) 40 with a deflectable size of the sub-sub-deflector 216. A shot figure is written at each of shot positions 42 of each TF 40.

A digital signal for blanking control is output from the deflection control circuit 120 to the DAC amplifier 130. The DAC amplifier 130 converts the digital signal to an analog signal, and applies the analog signal after being amplified to the blanking deflector 212 as a deflection voltage. The deflection voltage causes the electron beam 200 to be deflected, and blanking control is performed on each shot.

A digital signal for shaping deflection is output from the deflection control circuit 120 to the DAC amplifier 138. The DAC amplifier 138 converts the digital signal to an analog signal, and applies the analog signal after being amplified to the deflector 205 as a deflection voltage. The deflection voltage causes the electron beam 200 to be deflected to a specific position of the second shaping aperture 206, and an electron beam having desired size and shape is formed.

A digital signal for main deflection control is output from the deflection control circuit 120 to the DAC amplifier 134. The DAC amplifier 134 converts the digital signal to an analog signal, and applies the analog signal after being amplified to the main deflector 208 as a deflection voltage. The deflection voltage causes the electron beam 200 to be deflected, and the beam of each shot is deflected to a reference position A (for example, the center position or the lower left corner position of a corresponding sub-field (SF)) of a predetermined SF which is virtually divided in a mesh shape. When writing is performed while the XY stage 105 is continuously moved, the deflection voltage also includes a deflection voltage for tracking to follow the movement of the stage.

A digital signal for sub-deflection control is output from the deflection control circuit 120 to the DAC amplifier 132. The DAC amplifier 132 converts the digital signal to an analog signal, and applies the analog signal after being amplified to the sub-deflector 209 as a deflection voltage. The deflection voltage causes the electron beam 200 to be deflected, and the beam of each shot is deflected to a reference position B (for example, the center position or the lower left corner position of a corresponding TF) of a TF 40 which is the smallest deflection area.

A digital signal for sub-sub-deflection control is output from the deflection control circuit 120 to the DAC amplifier 136. The DAC amplifier 136 converts the digital signal to an analog signal, and applies the analog signal after being amplified to the sub-sub-deflector 216 as a deflection voltage. The deflection voltage causes the electron beam 200 to be deflected, and the beam of each shot is deflected to each shot position 42 in the TF 40.

In the writing apparatus 100, a writing process is performed on each strip area 20 using deflectors in multiple stages. Here, as an example, a three-stage deflector is used, which includes the main deflector 208, the sub-deflector 209, and the sub-sub-deflector 216. While the XY stage 105 is continuously moved, for example, in the −x direction, writing is performed on the first strip area 20 in the x direction. After the writing on the first strip area 20 is completed, writing on the second strip area 20 is performed similarly or in the opposite direction. Subsequently, similarly, writing is performed on the third and subsequent strip area 20.

The main deflector 208 sequentially deflects the electron beam 200 to the reference position A of the SF 30 so as to follow the movement of the XY stage 105. In addition, the sub-deflector 209 sequentially deflects the electron beam 200 from the reference position A of each SF 30 to the reference position B of a following TF 40. The sub-sub-deflector 216 then deflects the electron beam 200 from the reference position B of each TF 40 to the shot position 42 irradiated with a beam in the TF 40.

In this manner, the main deflector 208, the sub-deflector 209, and the sub-sub-deflector 216 have deflection areas in different sizes. The TF 40 is the smallest deflection area among the deflection areas of the deflectors in multiple stages.

The storage device 140 is, for example, a magnetic disk device, and stores writing data for writing a pattern on the substrate 101. The writing data is such data that is converted from design data (layout data) to a format for the writing apparatus 100, and is input from an external device to the storage device 140, and stored therein.

Figure 12:
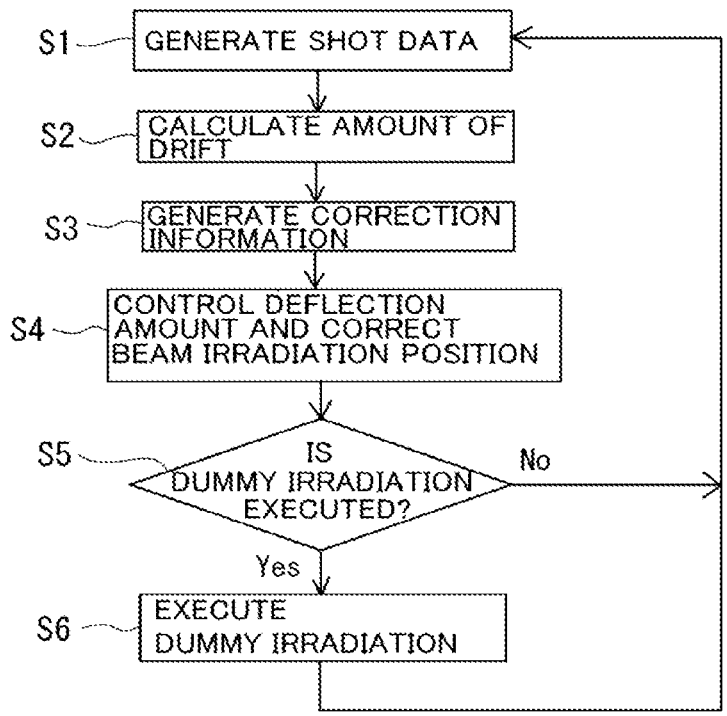
FIG. 12 is a flowchart illustrating a charged particle beam writing method according to the embodiment.

The process of each unit of the control computer 110 will be described along the flowchart illustrated in FIG. 12. The shot data generator 50 performs a data conversion process in multiple stages on the writing data stored in the storage device 140, divides each figure pattern as a writing target into shot figures in a size, each of which can be irradiated by a single shot, and generates shot data in a format specific to the writing apparatus (step S1). In the shot data, for example, a figure code indicating the figure type of each shot figure, a figure size (shot size), a shot position, beam ON and OFF times are defined for each shot. The generated shot data is temporarily stored in the memory 112.

The beam ON time included in the shot data is obtained by calculating the irradiation amount (dose amount) Q of the electron beam at each position of the writing area 10 in consideration of factors which cause a dimensional variation of a pattern, such as a proximity effect, a fogging effect, and a loading effect, and by dividing the calculated irradiation amount Q by a current density J. The beam OFF time is calculated from the stage movement speed, the beam movement amount during writing, and the settling time of the DAC amplifiers.

The generation of the shot data is performed concurrently with the writing process, and shot data for multiple shots is generated in advance, and stored in the memory 112. For example, the shot data for one strip area 20 is generated in advance, and stored in the memory 112.

In the present embodiment, the shot data generated in advance for multiple shots is referred to, and the amount of accumulated electric charge on each surface of the deflectors (the main deflector 208, the sub-deflector 209 or the sub-sub-deflector 216) is calculated using the accumulated number of shots of the multiple shots, an averaged shot size (beam size) and shot positions (beam deflection positions), and the accumulated beam ON and OFF times. The amount of drift is then calculated based on the amount of accumulated electric charge, and charge drift due to a charge up phenomenon is corrected in real time.

In order to correct the charge drift in real time, correction calculation is performed in advance before a writing process. In an actual writing process, a writing operation may be temporarily suspended due to waiting for data transfer or the like, and to calculate a charge amount in consideration of a writing suspension operation occurred after the correction calculation previously performed, the correction calculation needs to be performed again, which affects the throughput. For this reason, the effect of a writing operation suspension time is often not considered, and an error occurs between a calculated amount of drift and an actual amount of drift due to electric discharge during the writing suspension. Thus, in the present embodiment, in order to reduce the error, dummy irradiation (beam irradiation of the member to be irradiated 107) is performed at predetermined timings to saturate the amount of accumulated electric charge, thereby saturating the amount of drift, and reducing the difference between the calculated amount of drift and the actual amount of drift.

Figure 4:
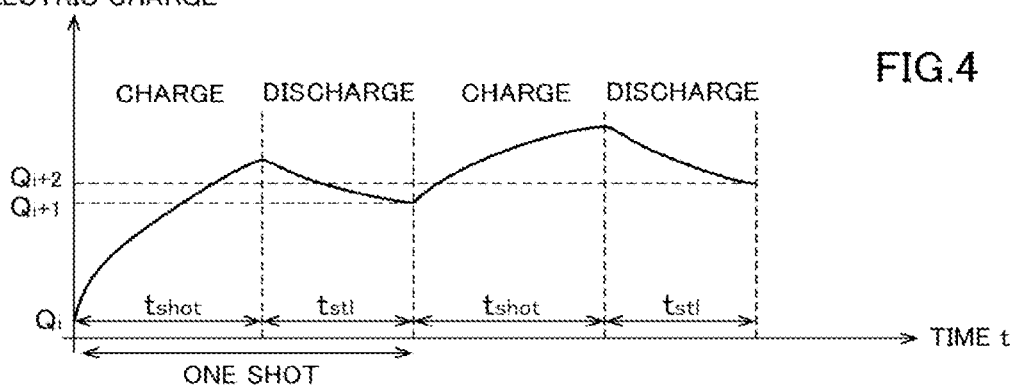
FIG. 4 is a graph illustrating a change in the amount of accumulated electric charge.

First, the correction calculation will be described. As illustrated in FIG. 4, one shot has a beam ON period $t_{shot}$ and a beam OFF period $t_{stl}$, and an electric charge phase due to scattered electrons at the time of beam irradiation (beam ON) and an electric discharge phase at the time of beam OFF are repeated on the deflector surfaces.

Figure 5:
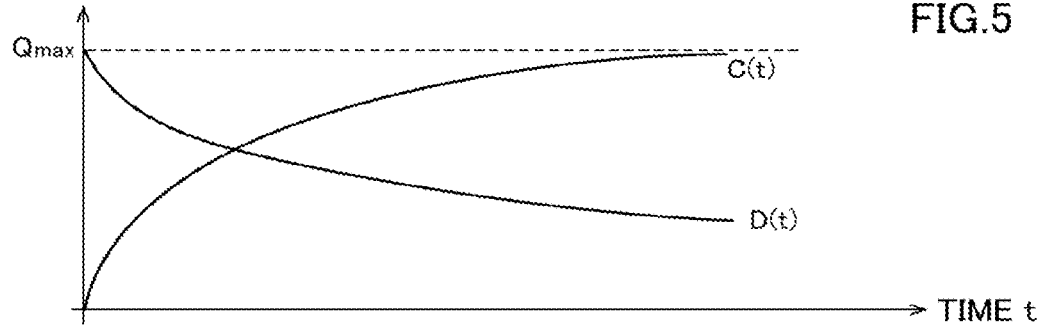
FIG. 5 shows graphs illustrating functions of electric charge and electric discharge.

In each of multiple electrodes included in the deflectors, the change in the accumulated amount of electric charge on the electrode surface can be expressed by functions C(t), D(t) illustrated in FIG. 5. The function C(t) shows electric charge at the time of beam ON, and the function D(t) shows electric discharge at the time of beam OFF. In the mathematical expressions in FIG. 5, $\tau_c$ is a time constant indicating likelihood of being electrically charged, and $\tau_d$ is a time constant indicating likelihood of being electrically discharged.

Let $Q_i$ be the accumulated amount of electric charge at the start time of the ith shot illustrated in FIG. 4, then the accumulated amount of electric charge $Q_{i+1}$ at the end time of the ith shot (at the start time of the (i+1)th shot), the accumulated amount of electric charge $Q_{i+2}$ at the end time of (i+1)th shot (at the start time of the (i+2)th shot) can be respectively expressed by Expression 1 below. In Expression 1, $Q_{max}$ is a saturated electron amount, $t_{shot}$ is a beam ON time (shot time), $t_{stl}$ is a beam OFF time (settling time), $\tau_c$ is a time constant for electric charge, and $\tau_d$ is a time constant for electric discharge.

$$Q_{i+1} = \exp\left(-\frac{t_{shot}}{\tau_c} - \frac{t_{stl}}{\tau_d}\right)\left[Q_{max}\left\{\exp\left(\frac{t_{shot}}{\tau_c}\right) - 1\right\} + Q_i\right] \quad \text{[Expression 1]}$$

$$Q_{i+2} = \exp\left(-\frac{t_{shot}}{\tau_c} - \frac{t_{stl}}{\tau_d}\right)\left[Q_{max}\left\{\exp\left(\frac{t_{shot}}{\tau_c}\right) - 1\right\} + Q_{i+1}\right]$$

The graph illustrated in FIG. 4 corresponds to a calculation expression when the accumulated amount of electric charge is calculated shot by shot. When the accumulated amount of electric charge is calculated shot by shot, the amount of calculation increases as the number of shots increases, thus it is difficult to perform drift correction in real time concurrently with the writing process. For this reason, in the present embodiment, the calculation speed is increased by calculating accumulated amounts of electric charge for multiple shots collectively, thereby making it possible to perform drift correction in real time.

Figure 6:
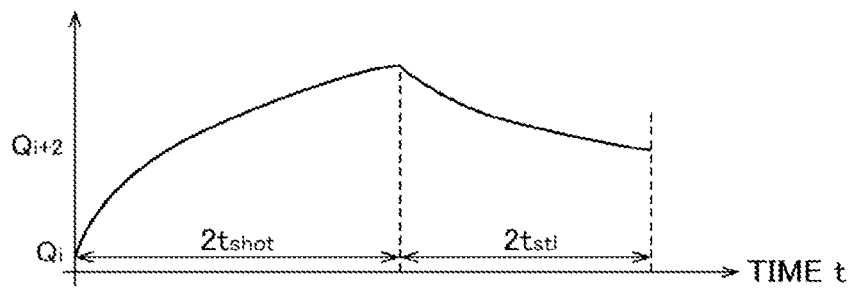
FIG. 6 is a graph illustrating a change in the amount of accumulated electric charge.

For instance, when the accumulated amount of electric charge is calculated for every two shots, it is possible to simplify the calculation by estimating that the accumulated amount of electric charge varies as in FIG. 6. In this case, the accumulated amount of electric charge $Q_{i+2}$ at the end time of the (i+1)th shot (at the start time of the (i+2)th shot) can be calculated by the following Expression 2 from the accumulated amount of electric charge $Q_i$ at the start time of the ith shot, thus the calculation in two steps can be finished in one step.

$$Q_{i+2} = \exp\left(-\frac{2t_{shot}}{\tau_c} - \frac{2t_{stl}}{\tau_d}\right)\left[Q_{max}\left\{\exp\left(\frac{2t_{shot}}{\tau_c}\right) - 1\right\} + Q_i\right] \quad \text{[Expression 2]}$$

Figure 7:
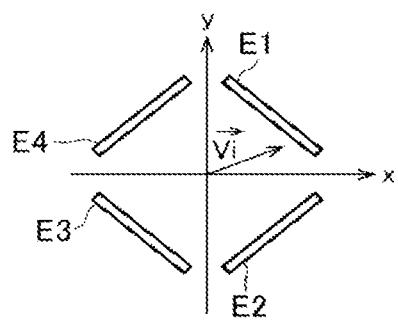
FIG. 7 is a view illustrating an example of a deflection electrode.

Also, since multiple electrodes are used in each deflector, charging sources are probably present at multiple positions. Thus, as illustrated in FIG. 7, a case will be discussed where a deflector consists of four electrodes E1 to E4, and the accumulated amount of electric charge (electric charge amount) of each electrode is calculated for every N shots (for N shots collectively). The accumulated amount of electric charge $Q_{i+N,\,j}$ after N shots can be determined by the following Expression 3 from the accumulated amount of electric charge $Q_{i,\,j}$ at the start time of the ith shot of the electrode Ej(j=1 to 4).

$$Q_{i+N,j} = \exp\left(-S \cdot A \frac{t_{shot(total)}}{\tau_{cj}} - \frac{t_{stl(total)}}{\tau_{dj}}\right) \quad \text{[Expression 3]}$$

$$\left[Q_{max}\left\{\exp\left(S \cdot A \frac{t_{shot(total)}}{\tau_{cj}}\right) - 1\right\} + Q_{i,j}\right]$$

$$S = \overline{shotsize}/maxshotsize$$

$$A = \left[1 + \tanh\left(\alpha \times \vec{n_j} \cdot \vec{V}\right)\right]/2$$

Accumulated number of shots: $N$

Accumulated shot time: $t_{shot(total)}$

Accumulated settling time ( = Accumulated writing time − Accumulated shot time): $t_{stl(total)}$ Average deflection direction: $\vec{V}$ Average shot size: $\overline{shotsize}$ In Expression 3, time constants $\tau_{cj}$, $\tau_{dj}$, coefficients $\alpha$, $Q_{max,\,j}$ are state parameters specific to the apparatus regardless of the writing layout, thus can be determined in advance from a result of measurement of a change in the drift under a condition that at least two of each of beam irradiation amount or shot interval and deflection position are provided.

The amount of drift can be calculated by the following Expression 4 using the accumulated amount of electric charge of each electrode.

$$\text{Drift } \vec{D_i} = \sum_j (-Q_{i,j})\vec{n_j} = \begin{pmatrix} -Q_{i1} - Q_{i2} + Q_{i3} + Q_{i4} \\ -Q_{i1} + Q_{i2} + Q_{i3} - Q_{i4} \end{pmatrix} \quad \text{[Equation 4]}$$

FIG. 8 illustrates an example of a relationship between the collective number of shots (the accumulated number N of shots in Expression 3) and the time taken to calculate the amount of drift for $1 \times 10^8$ shots. The greater the accumulated number N of shots is, the shorter time taken to calculate the amount of drift for $1 \times 10^8$ shots. Even when the accumulated number N of shots was changed to 100, 1000, 10000, 100000, 1000000, the calculated amount of drift hardly changed.

The calculation expression data including Expressions 3, 4 stated above and the time constants $\tau_{cj}$, $\tau_{dj}$, the coefficients $\alpha$, $Q_{max,\,j}$ is stored in the storage device 140. The drift corrector 52 retrieves the calculation expression data from the storage device 140. The drift corrector 52 refers to multiple pieces of shot data stored in the memory 112, calculates the accumulated shot time (the total of beam ON times) of multiple shots, the accumulated settling time (the total of beam OFF times), the average deflection direction, and the average shot size, and calculates the accumulated amount of electric charge of each electrode by substituting the calculated values into the calculation expression.

The drift corrector 52 calculates the amount of drift from the accumulated amount of electric charge of each electrode (step S2), and determines a drift correction amount which cancels the amount of drift. The drift corrector 52 generates correction information for the deflection amount (beam irradiation position) of the electron beam based on the drift correction amount (step S3), and provides the correction information to the writing controller 54. The writing controller 54 provides a correction amount for the beam irradiation position to the deflection control circuit 120 using the correction information.

The writing controller 54 transfers the shot data to the deflection control circuit 120. The deflection control circuit 120 outputs a signal for blanking control to the DAC amplifier 130 and outputs a signal for shaping deflection to the DAC amplifier 138 based on the shot data.

The deflection control circuit 120 outputs a signal for deflection control to the DAC amplifiers 132, 134, 136 based on the shot data and the correction amount for the beam irradiation position. Consequently, the beam irradiation position in the writer 150 is corrected (step S4).

The amount of drift calculated by the drift corrector 52 has a large difference from the actual amount of drift because electric discharge is performed during a time due to an event such as a subsequent unexpected writing interruption operation (a writing temporary suspension operation such as waiting for data transfer, stage waiting), the time being not used for calculation of the amount of drift. FIG. 9 illustrates an example of a calculated value of a drift amount, an actual amount of drift, and an accumulated value of errors when events occur. It is seen that the accumulated value of errors started to increase by triggering events occurred at times T1, T2, T3.

In the present embodiment, the dummy irradiation instructor 53 instructs the writing controller 54 at predetermined timings to execute dummy irradiation (Yes in step S5). The writing controller 54 executes dummy irradiation according to instructions from the dummy irradiation instructor 53 (step S6). The dummy irradiation may be performed at any timing, for example, may be performed at predetermined time intervals, or performed every time writing is executed on a predetermined number of strip areas 20. A relationship between irradiation time of dummy irradiation and amount of improvement of error in drift amount as illustrated in FIG. 10 is determined in advance, and an appropriate irradiation time of dummy irradiation is set. When the irradiation time of dummy irradiation is too short, the amount of improvement of the error in the drift amount is insufficient, and when the irradiation time is too long, the throughput is reduced.

Along with execution of the dummy irradiation, the drift corrector 52 calculates the amount of drift by substituting irradiation conditions for the dummy irradiation into the calculation expression stated above.

Figure 11:
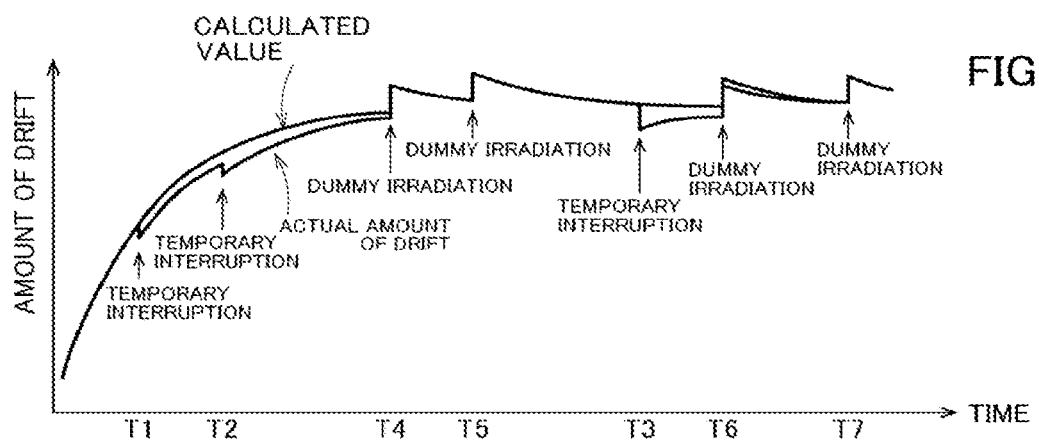
FIG. 11 is a graph illustrating a change in drift amount calculation value and a change in actual amount of drift when dummy irradiation is performed.

FIG. 11 illustrates an example of a change in drift amount calculation value and actual amount of drift when dummy irradiation is performed. An event occurs at times T1, T2, T3, and dummy irradiation is performed at times T4, T5, T6, T7. It is seen that the difference between the drift amount calculation value and the actual amount of drift was reduced by the dummy irradiation.

In this manner, according to the present embodiment, multiple pieces of shot data in a specific interval are referred to, and the amount of drift is calculated using the accumulated number of shots, the beam size averaged in the interval, the beam deflection position (deflection direction), the accumulated times of beam ON and OFF in the interval, thus it is possible to perform drift correction with high accuracy while reducing the amount of calculation. In addition, it is possible to reduce the difference between the calculated amount of drift and the actual amount of drift, and to improve the accuracy of writing by performing dummy irradiation at predetermined timings.

In the embodiment, an example has been described where dummy irradiation is performed at predetermined timings regardless of the presence or absence of an event. However, when occurrence of an event and an interruption time can be known, the dummy irradiation instructor 53 may calculate an electric discharge amount during writing suspension to determine the error from the calculated value of drift amount, and may determine the irradiation time of dummy irradiation from the magnitude of the error. The dummy irradiation for the determined irradiation time may be performed at one time or performed over multiple times.

Although the writing apparatus using a single beam has been described in the embodiment stated above, the writing apparatus may be a multi-beam writing apparatus. In that case, the shot position, the beam ON and OFF times, and the like are defined in the shot data.

At least part of the charged particle beam writing apparatus described in the above embodiments may be implemented in either hardware or software. When implemented in software, a program that realizes at least part of functions of the charged particle beam writing apparatus may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the charged particle beam writing apparatus may be distributed through a communication line (including wireless communications) such as the Internet. Further, the program may be encrypted, modulated, or compressed to be distributed through a wired line or wireless line such as the Internet or to be distributed by storing the program on a recording medium.

Although the present invention has been described in detail by way of the specific modes, it is apparent for those skilled in the art that various changes can be made without departing from the spirit and scope of the present invention.

The present application is based on Japanese Patent Application No. 2020-017697 filed on Feb. 5, 2020, the entire contents of which are incorporated herein by reference.

REFERENCE SIGNS LIST

50 SHOT DATA GENERATOR
52 DRIFT CORRECTOR
53 DUMMY IRRADIATION INSTRUCTOR
54 WRITING CONTROLLER
100 WRITING APPARATUS
107 MEMBER TO BE IRRADIATED

110 CONTROL COMPUTER
150 WRITER
160 CONTROLLER

The invention claimed is:

1. A charged particle beam writing apparatus comprising:
a charged particle beam source;
a deflector adjusting an irradiation position of the charged particle beam with respect to a substrate placed on a stage;
a shot data generator generating shot data from writing data, the shot data including a shot position and beam ON and OFF times for each shot;
a drift corrector referring to a plurality of pieces of the generated shot data, calculating an amount of drift of the irradiation position of the charged particle beam with which the substrate is irradiated, based on the shot position and the beam ON and OFF times of each of a plurality of shots, and generating correction information for correcting an irradiation position deviation based on the amount of drift;
a deflection controller controlling a deflection amount achieved by the deflector based on the shot data and the correction information; and
a dummy irradiation instructor instructing execution of dummy irradiation in a writing process to irradiate with the charged particle beam in a predetermined irradiation amount at a position different from the substrate on the stage.

2. The charged particle beam writing apparatus according to claim 1,
wherein the dummy irradiation instructor instructs execution of the dummy irradiation at predetermined timings or at each occurrence of an event.

3. The charged particle beam writing apparatus according to claim 2,
wherein the dummy irradiation instructor calculates an electric discharge amount during a time not used in the calculation of the amount of drift, and determines the irradiation amount of the dummy irradiation based on the electric discharge amount.

4. The charged particle beam writing apparatus according to claim 1,
wherein the deflector includes a plurality of electrodes, and
the drift corrector calculates an amount of accumulated electric charge of each of the plurality of electrodes based on a total of a beam ON time, a total of a beam OFF time, an average deflection direction and an average shot size of the plurality of shots, and calculates the amount of drift from the amount of accumulated electric charge of each electrode.

5. A charged particle beam writing method comprising:
discharging a charged particle beam;
adjusting an irradiation position of the charged particle beam using a deflector with respect to a substrate placed on a stage;
generating shot data from writing data, the shot data including a shot position and beam ON and OFF times for each shot;
referring to a plurality of pieces of the generated shot data, and calculating an amount of drift of the irradiation position of the charged particle beam with which the substrate is irradiated, based on the shot position and the beam ON and OFF times of each of a plurality of shots;
generating correction information for correcting an irradiation position deviation based on the amount of drift;
controlling a deflection amount achieved by the deflector based on the shot data and the correction information; and
executing dummy irradiation in a writing process to irradiate with the charged particle beam in a predetermined irradiation amount at a position different from the substrate on the stage.

6. The charged particle beam writing method according to claim 5,
wherein the dummy irradiation is executed at predetermined timings or at each occurrence of an event.

7. The charged particle beam writing method according to claim 5,
wherein an electric discharge amount during a time not used in the calculation of the amount of drift is calculated, and the irradiation amount of the dummy irradiation is determined based on the electric discharge amount.

8. The charged particle beam writing method according to claim 5,
wherein the deflector includes a plurality of electrodes, and
an amount of accumulated electric charge of each of the plurality of electrodes is calculated based on a total of a beam ON time, a total of a beam OFF time, an average deflection direction and an average shot size of the plurality of shots, and the amount of drift is calculated from the amount of accumulated electric charge of each electrode.

9. A computer readable recording medium storing a program causing a computer to execute a process comprising:
discharging a charged particle beam;
adjusting an irradiation position of the charged particle beam using a deflector with respect to a substrate placed on a stage;
generating shot data from writing data, the shot data including a shot position and beam ON and OFF times for each shot;
referring to a plurality of pieces of the generated shot data, and calculating an amount of drift of the irradiation position of the charged particle beam with which the substrate is irradiated, based on the shot position and the beam ON and OFF times of each of a plurality of shots;
generating correction information for correcting an irradiation position deviation based on the amount of drift;
controlling a deflection amount achieved by the deflector based on the shot data and the correction information; and
executing dummy irradiation in a writing process to irradiate with the charged particle beam in a predetermined irradiation amount at a position different from the substrate on the stage.

* * * * *